United States Patent
Li et al.

(10) Patent No.: US 11,387,833 B1
(45) Date of Patent: Jul. 12, 2022

(54) DIFFERENTIAL DIGITAL-TO-TIME CONVERTER FOR EVEN-ORDER INL CANCELLATION AND SUPPLY NOISE/DISTURBANCE REJECTION

(71) Applicant: QUALCOMM Incorporated, San Diego, CA (US)

(72) Inventors: Alvin Siu-Chi Li, San Diego, CA (US); Yue Chao, San Diego, CA (US); Dongmin Park, San Diego, CA (US); Heui In Yoon, San Diego, CA (US); Tomas O'Sullivan, San Diego, CA (US); Jianjun Yu, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/466,901

(22) Filed: Sep. 3, 2021

(51) Int. Cl.
*H03L 7/089* (2006.01)
*G04F 10/00* (2006.01)
*H04L 7/033* (2006.01)

(52) U.S. Cl.
CPC .......... *H03L 7/0891* (2013.01); *G04F 10/005* (2013.01); *H04L 7/033* (2013.01)

(58) Field of Classification Search
CPC ...... H03L 7/0891; G04F 10/005; H04L 7/033
See application file for complete search history.

(56) References Cited

U.S. PATENT DOCUMENTS 7,978,111 B2   7/2011  Sun et al.
8,022,849 B2   9/2011  Zhang et al.
9,331,722 B2*  5/2016  Ravi .................... H03M 1/1009
9,791,834 B1* 10/2017  Nassar .................... G04G 5/00
10,291,389 B1*  5/2019  Midha ................. H04L 27/0014
10,606,217 B2*  3/2020  Kim ........................ H03L 7/1974
10,788,794 B2*  9/2020  Degani ............... H03M 1/1014
10,895,850 B1*  1/2021  Elkholy ................ H03M 3/368
10,965,297 B1*  3/2021  Wu ........................ H03L 7/0805
(Continued)

FOREIGN PATENT DOCUMENTS

CN      105099446 B    4/2018
EP      3422580 A1     1/2019
(Continued)

OTHER PUBLICATIONS

Seong T., et al., "A -58dBc-Worst-Fractional-Spur and -234dB-FoMjitter, 5.5GHz Ring-DCO-Based Fractional-N DPLL Using a Time-Invariant-Probability Modulator, Generating a Nonlinearity-Robust DTC-Control Word", 2020 IEEE International Solid-State Circuits Conference, ISSCC 2020 / Session 17 / Frequency Synthesizers & VCOs / 17.3, Feb. 18, 2020, 3 pages.

*Primary Examiner* — Adam D Houston
(74) *Attorney, Agent, or Firm* — Loza & Loza LLP

(57) ABSTRACT

A method of quantization noise cancellation in a phase-locked loop (PLL) is provided according to certain aspects. The PLL includes a phase detector having a first input configured to receive a reference signal and a second input configured to receive a feedback signal. The method includes delaying the reference signal by a first time delay, delaying the feedback signal by a second time delay, receiving a delta-sigma modulator (DSM) error signal, and adjusting the first time delay and the second time delay in opposite directions based on the DSM error signal.

20 Claims, 9 Drawing Sheets

(56) References Cited

U.S. PATENT DOCUMENTS

| | | | |
|---|---|---|---|
| 11,075,642 B2 * | 7/2021 | Shi .......................... | H03L 7/099 |
| 11,184,013 B1 * | 11/2021 | Grimaldi ................ | H03C 3/095 |
| 11,223,362 B2 * | 1/2022 | Chiu ........................ | H03L 7/08 |
| 11,228,317 B1 * | 1/2022 | Kim ........................ | H03L 7/099 |
| 11,296,710 B2 * | 4/2022 | Roodnat ............... | H03L 7/0991 |
| 2017/0346493 A1 | 11/2017 | Markulic et al. | |
| 2017/0366376 A1 | 12/2017 | Wang et al. | |
| 2018/0205370 A1 | 7/2018 | Jin et al. | |
| 2018/0226985 A1 * | 8/2018 | Banin ..................... | H03M 1/82 |
| 2019/0280698 A1 * | 9/2019 | Kearney ............... | H03L 7/0814 |
| 2020/0067513 A1 | 2/2020 | Dgani et al. | |
| 2022/0014208 A1 * | 1/2022 | Choi ..................... | H03M 3/322 |

FOREIGN PATENT DOCUMENTS

| | | | | |
|---|---|---|---|---|
| KR | 20220006444 A | * | 5/2019 | |
| KR | 20220006444 A | * | 1/2022 | |

\* cited by examiner

| kr | kv | Δt_diff (ps) |
|---|---|---|
| 0 | 63 | -252 |
| 1 | 62 | -244 |
| 2 | 61 | -236 |
| 3 | 60 | -228 |
| 4 | 59 | -220 |
| 5 | 58 | -212 |
| ⋮ | ⋮ | ⋮ |
| 30 | 33 | -12 |
| 31 | 32 | -4 |
| 32 | 31 | 4 |
| 33 | 30 | 12 |
| ⋮ | ⋮ | ⋮ |
| 58 | 5 | 212 |
| 59 | 4 | 220 |
| 60 | 3 | 228 |
| 61 | 2 | 236 |
| 62 | 1 | 244 |
| 63 | 0 | 252 |

| kr | kv | Δt_diff (ps) |
|---|---|---|
| 0 | 63 | -252 |
| 0 | 62 | -248 |
| 1 | 62 | -244 |
| 1 | 61 | -240 |
| 2 | 61 | -236 |
| 2 | 60 | -232 |
| ... | ... | ... |
| 30 | 32 | -8 |
| 31 | 32 | -4 |
| 31 | 31 | 0 |
| 32 | 31 | 4 |
| 32 | 30 | 8 |
| ... | ... | ... |
| 60 | 2 | 232 |
| 61 | 2 | 236 |
| 61 | 1 | 240 |
| 62 | 1 | 244 |
| 62 | 0 | 248 |
| 63 | 0 | 252 |

DIFFERENTIAL DIGITAL-TO-TIME CONVERTER FOR EVEN-ORDER INL CANCELLATION AND SUPPLY NOISE/DISTURBANCE REJECTION

BACKGROUND

Field

Aspects of the present disclosure relate generally to phase-locked loops (PLLs), and, more particularly, to quantization noise cancellation in a PLL.

Background

A phase-locked loop (PLL) may be used to generate a signal having a desired frequency by multiplying the frequency of a reference signal by a corresponding amount. For example, a PLL may be used in a wireless communications system to generate a local oscillator signal for frequency upconversion/downconversion.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a phase detector, and a first digital-to-time converter (DTC) having a signal input, a control input, and an output, wherein the signal input of the first DTC is configured to receive a reference signal, and the output of the first DTC is coupled to a first input of the phase detector. The system also includes a second DTC having a signal input, a control input, and an output, wherein the signal input of the second DTC is configured to receive a feedback signal, and the output of the second DTC is coupled to a second input of the phase detector. The system further includes a decoder having an input, a first output, and a second output, wherein the input of the decoder is configured to receive a delta-sigma modulator (DSM) error signal, the first output of the decoder is coupled to the control input of the first DTC, and the second output of the decoder is coupled to the control input of the second DTC.

A second aspect relates to a method of quantization noise cancellation in a phase-locked loop (PLL). The PLL includes a phase detector having a first input configured to receive a reference signal and a second input configured to receive a feedback signal. The method includes delaying the reference signal by a first time delay, delaying the feedback signal by a second time delay, receiving a delta-sigma modulator (DSM) error signal, and adjusting the first time delay and the second time delay in opposite directions based on the DSM error signal.

A third aspect relates to an apparatus. The apparatus includes means for detecting a phase error between a reference signal and a feedback signal, means for delaying the reference signal by a first time delay, means for delaying the feedback signal by a second time delay, and means for adjusting the first time delay and the second time delay in opposite directions based on a delta-sigma modulator (DSM) error signal.

BRIEF DESCRIPTION OF THE DRAWINGS

FIG. 5 shows an example of a table including exemplary codes for adjusting a differential time delay of the differential DTC according to certain aspects of the present disclosure.

FIG. 6 shows another example of a table including exemplary codes for adjusting the differential time delay of the differential DTC according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
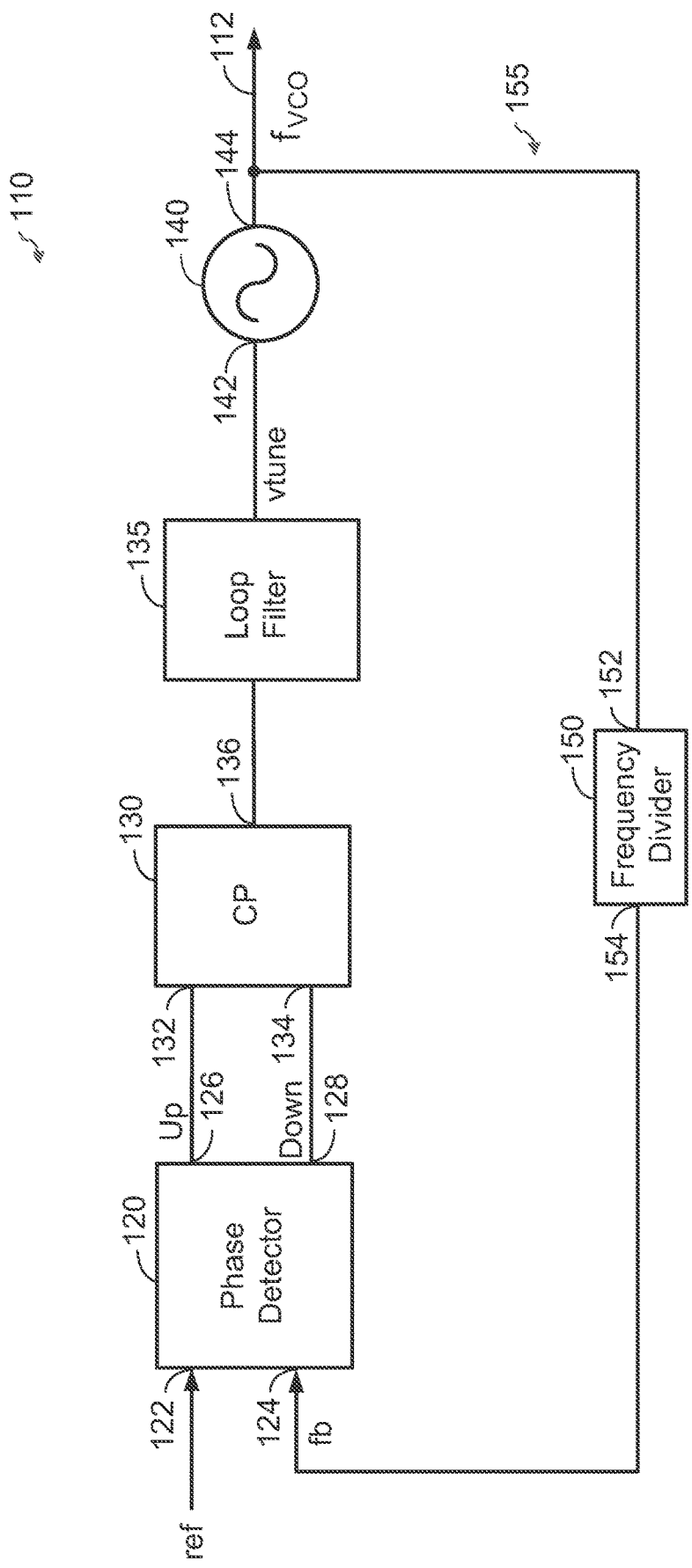
FIG. 1 shows an example of a phase-locked loop (PLL) according to certain aspects of the present disclosure.

FIG. 1 shows an example of a phase-locked loop (PLL) 110 according to certain aspects of the present disclosure. The PLL 110 may be used, for example, in a wireless device to generate a local oscillator signal (e.g., for frequency upconversion and/or frequency downconversion). In this example, the PLL 110 includes a phase detector 120, a charge pump 130, a loop filter 135, a voltage-controlled oscillator (VCO) 140, and a frequency divider 150. The phase detector 120 may also be referred to as a phase frequency detector (PFD), a phase comparator, or another term.

The phase detector 120 has a first input 122, a second input 124, a first output 126, and a second output 128. The first input 122 is configured to receive a reference signal (labeled "ref"). The reference signal is a periodic signal (e.g., clock signal) having a reference frequency. The reference signal may be provided by a crystal oscillator (not shown) or another source.

The charge pump 130 has a first input 132 coupled to the first output 126 of the phase detector 120, a second input 134 coupled to the second output 128 of the phase detector, and an output 136. The loop filter 135 is coupled between the output 136 of the charge pump 130 and an input 142 of the VCO 140. As discussed further below, the VCO 140 is configured to generate an output signal having a frequency (labeled "$f_{VCO}$") that is controlled by a control voltage (labeled "vtune") at the input 142 of the VCO 140. The output signal is output at an output 144 of the VCO 140, which may be coupled to the output 112 of the PLL 110.

The frequency divider 150 has an input 152 and an output 154. The input 152 of the frequency divider 150 is coupled to the output 144 of the VCO 140, and the output 154 of the frequency divider 150 is coupled to the second input 124 of the phase detector 120. Thus, in this example, the output signal of the VCO 140 is fed back to the second input 124 of the phase detector 120 through the frequency divider 150 via a feedback loop 155. In one example, the frequency divider 150 is configured to divide the frequency of the output signal of the VCO 140 by a divider N to generate a feedback signal (labeled "fb"). Thus, in this example, the feedback signal has a frequency approximately equal to $f_{VCO}/N$. The feedback signal is output at the output 154 of the frequency divider 150 and input to the second input 124 of the phase detector 120.

In operation, the phase detector 120 receives the reference signal at the first input 122 and receives the feedback signal at the second input 124. The phase detector 120 is configured to detect a phase error between the reference signal and the feedback signal and generate a phase-error signal based on the detected phase error. In certain aspects, the phase error is given as a time error between the reference signal and the feedback signal, in which the time error may be defined as a time difference between an edge (e.g., rising edge) of the reference signal and an edge (e.g., rising edge) of the feedback signal. In these aspects, the time error is approximately zero when the phase of the reference signal and the phase of the feedback signal are aligned.

In certain aspects, the phase-error signal may include Up pulses and/or Down pulses that are functions of the detected phase error (i.e., time error). For example, the phase detector 120 may output an Up pulse at the first output 126 when the reference signal leads the feedback signal, in which the width of the Up pulse may be equal to the time error between the reference signal and the feedback signal. The phase detector 120 may output a Down pulse at the second output 128 when the feedback signal leads the reference signal, in which the width of the Down pulse may be equal to the time error between the reference signal and the feedback signal.

The charge pump 130 receives an Up pulse from the phase detector 120 via the first input 132 and receives a down pulse from the phase detector 120 via the second input 134. When the charge pump 130 receives an Up pulse, the charge pump 130 charges the loop filter 135 for the duration of the Up pulse, which increases the control voltage vtune. When the charge pump 130 receives a Down pulse, the charge pump 130 discharges the loop filter 135 for the duration of the Down pulse, which decreases the control voltage vtune. For example, the loop filter 135 may include a resistor-capacitor (RC) filter in which the charge pump 130 charges/discharges one or more capacitors in the RC filter to adjust the control voltage vtune. The control voltage vtune is input to the VCO 140 and controls the output frequency $f_{VCO}$ of the VCO 140, as discussed above.

The feedback loop 155 of the PLL 110 causes the phase detector 120, the charge pump 130 and the loop filter 135 to adjust the control voltage vtune at the input 142 of the VCO 140 in a direction that reduces the phase error (i.e., time error) between the feedback signal and the reference signal. When the PLL 110 is locked, the frequency of the feedback signal is approximately equal to the frequency of the reference signal. This causes the output frequency of the VCO 140 to be approximately equal to the frequency of the reference signal multiplied by the divider N of the frequency divider 150. In other words, the output frequency is given by the following:

$$f_{VCO} = N \cdot f_{ref} \tag{1}$$

where $f_{ref}$ is the reference frequency (i.e., frequency of the reference signal). Thus, in this example, the output frequency of the VCO 140 is a multiple of the reference frequency and may be set to a desired frequency by setting the divider N of the frequency divider 150 accordingly based on equation (1).

Figure 2:
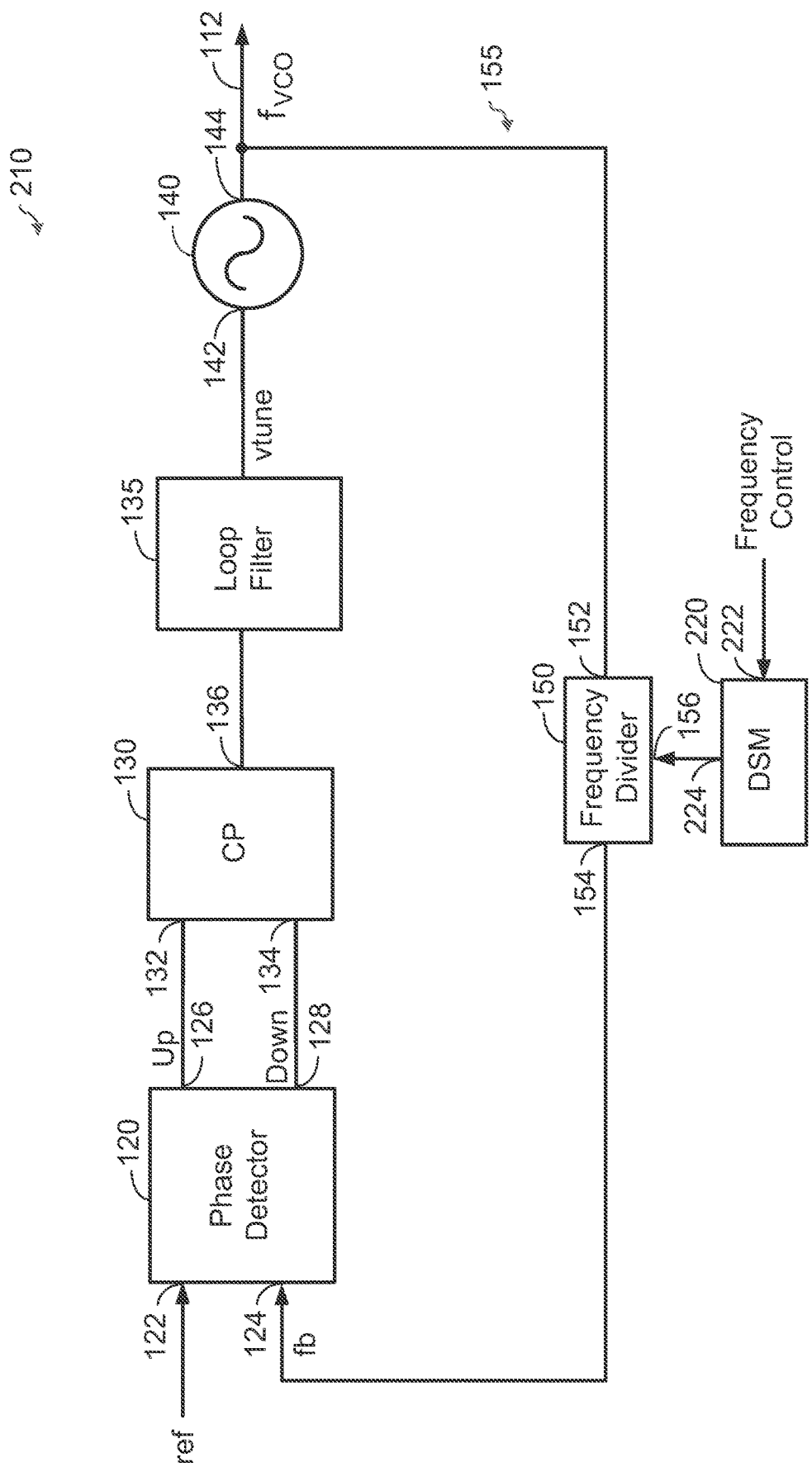
FIG. 2 shows an example of a fractional-N PLL according to certain aspects of the present disclosure.

In the above example, the divider N is an integer. However, in many applications, a fractional divider is needed to achieve a desired frequency. In these applications, a fractional-N PLL 210 may be used, an example of which is shown in FIG. 2. In the example in FIG. 2, the fractional-N PLL 210 includes the phase detector 120, the charge pump 130, the loop filter 135, the VCO 140, and the frequency divider 150 discussed above. The fractional-N PLL 210 further includes a delta-sigma modulator (DSM) 220 (also referred to as a sigma-delta modulator).

In this example, the DSM 220 has an input 222 and a control output 224. The control output 224 of the DSM 220 is coupled to a control input 156 of the frequency divider 150. In this example, the frequency divider 150 is configured to set the divider N of the frequency divider 150 to any one of multiple integer values based on a divider control signal received from the DSM 220 via the control input 156.

In operation, the DSM 220 is configured to receive a frequency control signal (e.g., frequency control word) at the input 222 indicating a desired fractional divider value. The DSM 220 modulates (i.e., dithers) the divider of the frequency divider 150 using the divider control signal such that the average value of the divider is approximately equal to the desired fractional divider value over multiple cycles (i.e., periods) of the reference signal. The DSM 220 may modulate the divider of the frequency divider 150 by changing the divider of the frequency divider 150 between two or more integer values over multiple cycles of the reference signal such that the average value of the divider is approximately equal to the desired fractional divider value. For example, the DSM 220 may achieve an average fractional divider value of 6.25 over four cycles of the reference signal by setting the divider of the frequency divider 150 to 6 for three of the four cycles and to 7 for one of the four cycles. The DSM 220 may be implemented with a first-order DSM, a second-order multi-state noise shaping (MASH) DSM, a third-order MASH DSM, or another type of DSM.

Thus, the DSM 220 allows the fractional-N PLL 210 to achieve a fractional divider. However, modulating the divider of the frequency divider 150 introduces quantization error (i.e., quantization noise) into the feedback signal. The quantization error causes fluctuations in the phase error (i.e., time error) between the reference signal and the feedback signal, which degrades performance.

Figure 3:
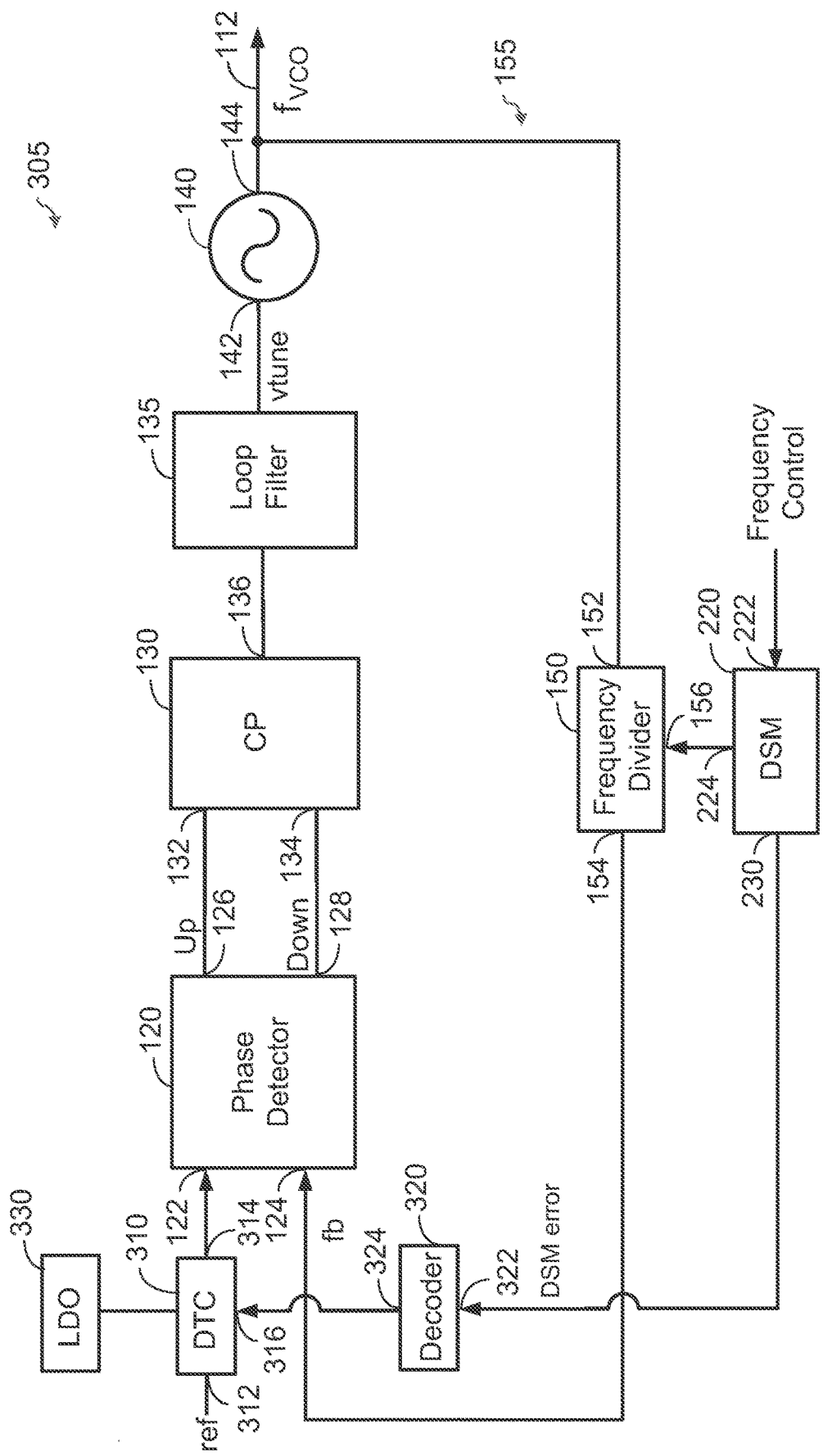
FIG. 3 shows an example of a PLL including a digital-to-time converter (DTC) for quantization noise cancellation according to certain aspects of the present disclosure.

FIG. 3 shows an example of a fractional-N PLL 305 employing a previous approach for cancelling the quantization error (i.e., quantization noise) according to certain aspects. The fractional-N PLL 305 includes the phase detector 120, the charge pump 130, the loop filter 135, the VCO 140, the frequency divider 150, and the DSM 220 discussed above. The fractional-N PLL 305 further includes a digital-to-time converter (DTC) 310 and a decoder 320.

The DTC 310 has a signal input 312, a control input 316, and an output 314. The signal input 312 is configured to receive the reference signal and the control input 316 is configured to receive a code. The output 314 of the DTC 310 is coupled to the first input 122 of the phase detector 120. In operation, the DTC 310 is configured to delay the reference signal by a tunable (i.e., adjustable) time delay based on the code, and to output the resulting time-delayed reference signal at the output 314, which is coupled to the first input 122 of the phase detector 120. Thus, the DTC 310 adjusts the timing of the reference signal relative to the feedback signal by the time delay that is controlled by the code received at the control input 316.

The decoder 320 has an input 322 and an output 324. The input 322 is coupled to an error output 230 of the DSM 220 and the output 324 is coupled to the control input 316 of the DTC 310. As discussed further below, the decoder 320 is configured to generate the code that controls the time delay of the DTC 310.

In operation, the DSM 220 is configured to generate a DSM error signal indicating the quantization error of the DSM 220, and to output the DSM error signal at the error output 230. The DSM 220 generates the DSM error signal based on a difference between the fractional divider value indicated by the frequency control signal and the divider value indicated by the divider control signal input to the control input 156 of the frequency divider 150. The decoder 320 is configured to receive the DSM error signal at the input 322, and generate a code corresponding to a time delay that cancels the quantization error indicated by the DSM error signal. The decoder 320 outputs the code to the control input 316 of the DTC 310, which adjusts the timing of the reference signal by the time delay to cancel the quantization error.

The decoder 320 is able to cancel the quantization error of the DSM 220 by adjusting the time delay of the reference signal based on the DSM error signal to cancel the fluctuations in the time error between the reference signal and the feedback signal caused by the quantization error. The cancellation of the quantization error increases the bandwidth of the PLL 305 and reduces settling time. However, the DTC 310 (e.g., DTC) may have non-linearity which limits the amount of quantization noise cancellation that can be achieved and degrades integrated phase noise (IPN).

The DTC 310 receives a supply voltage from a voltage regulator such as a low dropout (LDO) regulator 330. The LDO regulator 330 introduces supply noise into the DTC 310, which further degrades performance of the DTC 310.

Figure 4:
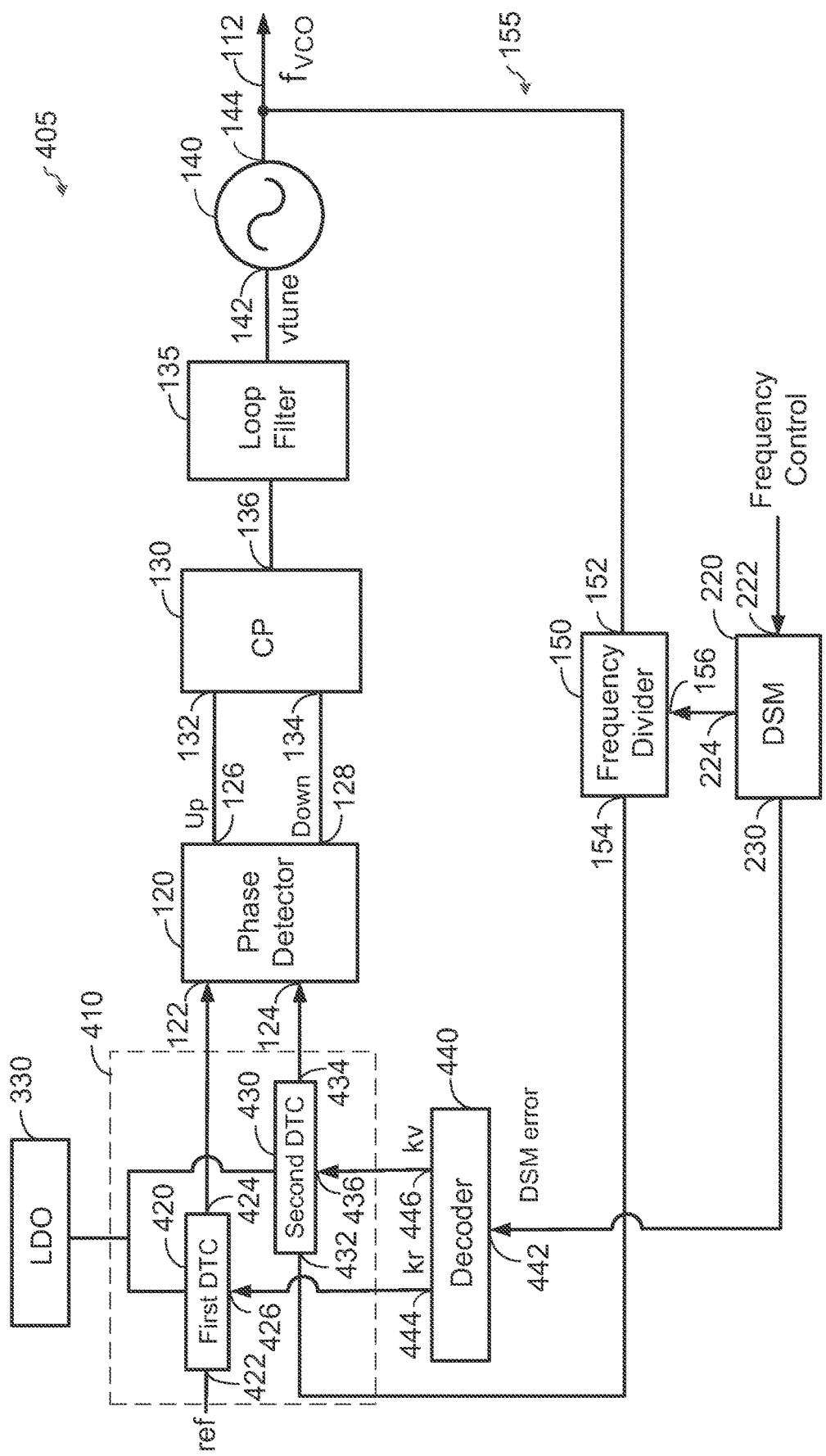
FIG. 4 shows an example of a PLL including a differential DTC according to certain aspects of the present disclosure.

FIG. 4 shows an example of a fractional-N PLL 405 including a differential DTC 410 for cancelling the quantization error (i.e., quantization noise) of the DSM 220 according to certain aspects. As discussed further below, the differential DTC 410 cancels even-order integral nonlinearity (INL) terms and reduces supply noise, which improves performance over the approach discussed above with reference to FIG. 3.

In this example, the fractional-N PLL 405 includes the phase detector 120, the charge pump 130, the loop filter 135, the VCO 140, the frequency divider 150, and the DSM 220 discussed above. The fractional-N PLL 405 further includes a decoder 440 and the differential DTC 410 discussed above. The differential DTC 410 includes a first DTC 420 in the reference signal path of the PLL 405 and a second DTC 430 in the feedback signal path of the PLL 405. The first DTC 420 has a signal input 422, a control input 426, and an output 424. The signal input 422 is configured to receive the reference signal, the control input 426 is configured to receive a first code, and the output 424 is coupled to the first input 122 of the phase detector 120. The second DTC 430 has a signal input 432, a control input 436, and an output 434. The signal input 432 is coupled to the output 154 of the frequency divider 150 to receive the feedback signal, the control input 436 is configured to receive a second code, and the output 434 is coupled to the second input 124 of the phase detector 120.

In operation, the first DTC 420 is configured to delay the reference signal by a tunable (i.e., adjustable) time delay based on the first code, and to output the resulting time-delayed reference signal at the output 424, which is coupled to the first input 122 of the phase detector 120. The second DTC 430 is configured to delay the feedback signal by a tunable (i.e., adjustable) time delay based on the second code, and to output the resulting time-delayed feedback signal at the output 434, which is coupled to the second input 124 of the phase detector 120. In the example shown in FIG. 4, the first DTC 420 and the second DTC 430 receive a supply voltage from a common LDO regulator 330. As discussed further below, this allows the differential DTC 410 to reduce the supply noise from the LDO regulator 330.

The first DTC 420 and the second DTC 430 adjust the time error between the reference signal and the feedback signal at the phase detector 120 by a differential time delay where the differential time delay is the difference between the time delay of the first DTC 420 and the time delay of the second DTC 430. As discussed further below, the differential time delay is used to cancel the quantization error of the DSM 220 by adjusting the differential time delay based on the DSM error signal to cancel the fluctuations in the time error between the reference signal and the feedback signal caused by the quantization error.

The decoder 440 has an input 442, a first output 444, and a second output 446. The input 442 is coupled to the error output 230 of the DSM 220, the first output 444 is coupled to the control input 426 of the first DTC 420, and the second output 446 is coupled to the control input 436 of the second DTC 430. As discussed further below, the decoder 440 is configured to output the first code (labeled "kr") via the first output 444 to control the time delay of the first DTC 420, and to output the second code (labeled "kv") via the second output 446 to control the time delay of the second DTC 430. This allows the decoder 440 to adjust the differential time delay of the differential DTC 410 by adjusting the time delay of the first DTC 420 and adjusting the time delay of the second DTC 430.

In operation, the DSM 220 is configured to generate the DSM error signal indicating the quantization error of the DSM 220, and to output the DSM error signal at the error output 230. The decoder 440 is configured to receive the DSM error signal at the input 442, and to adjust the differential time delay of the differential DTC 410 to cancel the quantization error indicated by the DSM error signal. For example, the decoder 440 may adjust the differential time delay such that the differential time delay is approximately equal to the time delay of the DTC 310 discussed above to cancel the quantization error (i.e., quantization noise) of the DSM 220.

In certain aspects, the decoder 440 is configured to adjust the differential time delay between the reference signal and the feedback signal to cancel the quantization error indicated by the DSM error signal by adjusting (i.e., tuning) the first code kr and the second code kv in opposite directions. For example, when the decoder 440 increases the first code kr to adjust the differential time delay, the decoder 440 decreases the second code kv (e.g., by an equal amount), or vice versa.

In other words, if the decoder 440 changes the first code kr by Δk to adjust the differential time delay, then the decoder 440 may change the second code kv by −Δk.

Adjusting the first code kr and the second code kv in opposite directions to adjust the differential time delay cancels even-order INL terms, which substantially reduces INL compared with the PLL 305 shown in FIG. 3 which uses a single DTC 310. This can be demonstrated by the following example. In this example, it is assumed the second code kv is the complement of the first code kr (i.e., kv=−kr) since the decoder 440 adjusts (i.e., tunes) the first code kr and the second code kv in opposite directions. In this example, the time delay of the first DTC 420 may be modelled by the following non-linear transfer function:

$$\Delta tr = a_1 kr + a_2 kr^2 + a_3 kr^3 + a_4 kr^4 + \ldots + a_n kr^n \quad (2)$$

where Δtr is the time delay of the first DTC 420 and $a_1$ to $a_n$ are coefficients of the non-linear transfer function. In this example, the first order term $a_1 kr$ (i.e., linear term) represents a linear time delay while the higher order terms model the non-linearities of the first DTC 420. Similarly, the time delay of the second DTC 430 may be modelled by the following non-linear transfer function:

$$\Delta tv = a_1 kv + a_2 kv^2 + a_3 kv^3 + a_3 kv^4 \ldots + a_n kv^n \quad (3)$$

where Δtv is the time delay of the second DTC 430 and $a_1$ to $a_n$ are coefficients of the non-linear transfer function. In this example, the first order term $a_1 kv$ (i.e., linear term) represents a linear time delay while the higher order terms model the non-linearities of the second DTC 430. Substituting −kr for kv results in the following:

$$\Delta tv = -a_1 kr + a_2 kr^2 + -a_3 kr^3 + a_3 kr^4 \ldots + (-1)^n a_n kr^n \quad (4)$$

Note that the even terms in equation (4) are positive since an even power of −kr is positive. Thus, for high linearity and low INL, it is desirable to reduce the higher order terms with respect to the first order term (i.e., linear term).

In this example, the differential time delay of the differential DTC 410 may be given as follows:

$$\Delta t\_diff = \Delta tr - \Delta tv \quad (5)$$

where Δt_diff is the differential time delay. Substituting the non-linear transfer functions for Δtr and Δtv given in equations (2) and (4) into equation (5) results in the following:

$$\Delta t\_diff = a_1 kr + a_2 kr^2 + a_3 kr^3 + a_4 kr^4 + \ldots + a_n kr^n - [-a_1 kr + a_2 kr^2 + -a_3 kr^3 + a_3 kr^4 \ldots + (-1)^n a_n kr^n] \quad (6)$$

which simplifies to:

$$\Delta t_{diff} = 2a_1 kr + 2a_3 kr^3 + \ldots \quad (7)$$

As shown in equation (7), the even-order INL terms (e.g., $a_2 kr^2$) are canceled out in the differential time delay. This reduces the contribution of the INL terms to the differential time delay relative to the linear term (i.e., $2a_1 kr$), and therefore reduces INL. Thus, equation (7) shows that adjusting the first code kr and the second code kv in opposite directions cancels the even-order INL terms in the differential time delay, which substantially reduces INL and improves linearity compared with the PLL 305 in FIG. 3 which uses a single DTC 310. In the above example, by adjusting the first code kr and the second code kv in opposite directions, the decoder 440 moves the time delay of the first DTC 420 and the time delay of the second DTC 430 in opposite directions.

The differential DTC 410 also substantially reduces supply noise from the LDO regulator 330. This is because the supply noise is common to both the first DTC 420 and the second DTC 420. As a result, the common supply noise is canceled out by the differential time delay of the differential DTC 410, which is the difference between the time delay of the first DTC 420 and the time delay of the second DTC 430. Thus, the differential DTC 410 also provides common LDO noise cancellation.

In certain aspects, any one of a number of codes within a code range (e.g., 0 to 63) may be input to each of the first DTC 420 and the second DTC 430. In one example, the first code kr and the second code kv may be complementary with respect to a midpoint that is located approximately in the center of the code range. In this example, the first code kr is given by:

$$kr = k_{mid} + \Delta k \quad (8)$$

where $k_{mid}$ is the midpoint. Also, in this example, the second code kv is given by:

$$kv = k_{mid} - \Delta k \quad (9).$$

In this example, the second code kv is the complement of the first code kr with respect to the midpoint, in which the decoder 440 adjusts (i.e., tunes) the first code kr and the second code kv in opposite directions by Δk. In this example, the even-order INL terms in the differential time delay that include the even-order code terms $\Delta k^2$, $\Delta k^4$, etc. cancel out in the differential time delay, which reduces INL and improves linearity. This can be demonstrated by substituting the expressions for the first code kr and the second code kv given in equations (8) and (9), respectively, into equations (3), (4), and (5).

In the above example, the decoder 440 adjusts the differential time delay by changing the first code kr and the second code kv in opposite directions by the amount Δk. However, it is to be appreciated that the first code kr and the second code kv do not have to be changed (i.e., adjusted) in opposite directions by exactly the same amount. In general, the decoder 440 may change (i.e., adjust) the first code kr and the second code kv in opposite directions by approximately the same (i.e., equal) amount. As used here, the term "approximately" means that the second code kv is changed by an amount that is equal to 90 percent to 110 percent of the amount by which the first code kr is changed. In this case, while the second-order INL terms in the differential time delay do not exactly cancel out, the second-order INL terms are substantially reduced, resulting in reduced INL and improved linearity.

FIG. 5 shows an example of a table 500 including exemplary codes for the first code kr and the second code kv for different differential time delay settings of the differential DTC 410. In this example, each of the first code kr and the second code kv has a range 0 to 63 corresponding to 64 different time delay settings. Also, in this example, the first code kr and the second code kv are complementary with respect to a midpoint of approximately 31.5. Note that, in this example, the midpoint does not have an exact corresponding code (i.e., the midpoint is between codes 31 and 32). It is to be appreciated that in other examples, there may be an exact midpoint code.

In the example shown in FIG. 5, one delay step for each of the first DTC 420 and the second DTC 430 is approximately equal to 4 picoseconds (ps). However, it is to be appreciated that the present disclosure is not limited to this exemplary step size. As shown in FIG. 5, the first code kr and the second code kv move in opposite directions to adjust the differential time delay. In addition, the delay step size of the differential DTC 410 is approximately 8 ps in this example, which is twice the delay step size of each of the first DTC 420 and the second DTC 430. This is because, when the time delay of the first DTC 420 is increased by one delay step size of the first DTC 420, the time delay of the second DTC 430 is decreased by one delay step size of the second DTC 430, and vice versa. Note that only a portion of the entries in table 500 are shown in FIG. 5.

It is to be appreciated that each of the first code kr and the second code kv may have a code range other than the exemplary range of 0 to 63 illustrated in FIG. 5. For example, each of the first code kr and the second code kv may have code range of 0 to 31, a code range of 0 to 127, or another code range. It is also to be appreciated that one delay step size is not limited to the example of 4 ps.

In the example illustrated in table 500, the delay step size of the differential DTC 410 is twice the delay step size of each of the first DTC 420 and the second DTC 430. FIG. 6 shows an example of a table 600 including exemplary codes for the first code kr and the second code kv for different differential time delay settings, in which the delay step size of the differential DTC 410 is equal to one delay step size of each of the first DTC 420 and the second DTC 430. As shown in FIG. 6, this is accomplished by changing the first code kr and the second code kv one at a time in table 600, which doubles the number of entries in table 600 compared with table 500 and reduces the delay step size of the differential DTC 410 from 8 ps to 4 ps. This increases the resolution of the differential DTC 410, which improves the quantization noise cancellation (e.g., by 6 dB). Note that only a portion of the entries in table 600 are shown in FIG. 6.

It is to be appreciated that aspects of the present disclosure are not limited to the exemplary PLL implementation shown in FIG. 4, and that aspects of the present disclosure may be used in other PLL implementations to improve linearity and/or reduce common supply noise. For example, aspects of the present disclosure may be used in a PLL with just one phase detector output to the charge pump instead of two phase detector outputs. In another example, the phase detector 120 may be implemented with a differential sampling phase detector coupled to the loop filter 135 without the charge pump 130. Thus, aspects of the present disclosure are not limited to a particular PLL topology.

Figure 7:
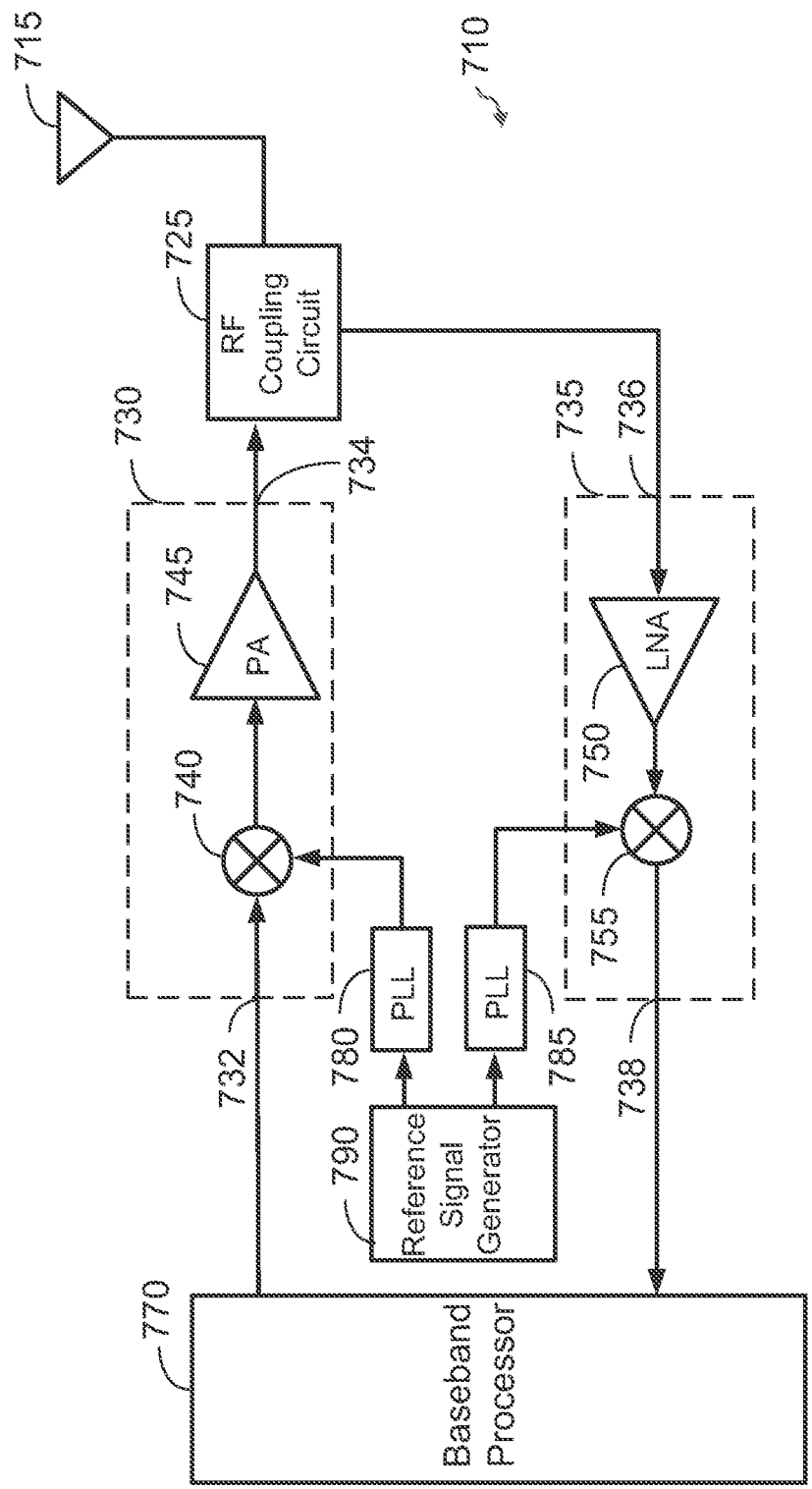
FIG. 7 shows an exemplary wireless device according to certain aspects of the present disclosure.

FIG. 7 illustrates a wireless device 710 in which the exemplary PLL 405 may be used according to certain aspects. The wireless device 710 may include a transmitter 730 and a receiver 735 for wireless communications (e.g., with a base station). The wireless device 710 may also include a baseband processor 770, a radio frequency (RF) coupling circuit 725, an antenna 715, a reference signal generator 790, a first PLL 780, and a second PLL 785. Although one transmitter 730, one receiver 735, and one antenna 715 are shown in FIG. 7, it is to be appreciated that the wireless device 710 may include any number of transmitters, receivers, and antennas.

In the example in FIG. 7, the transmitter 730 has an input 732 coupled to the baseband processor 770, and an output 734 coupled to the antenna 715 via the RF coupling circuit 725. The transmitter 730 may include a mixer 740, and a power amplifier 745. The mixer 740 is coupled between the input 732 and the power amplifier 745, and the power amplifier 745 is coupled between the mixer 740 and the output 734. In one example, the mixer 740 is configured to receive a baseband signal from the baseband processor 770 via the input 732 and mix the baseband signal with a local oscillator signal to frequency upconvert the baseband signal into an RF transmit signal. The power amplifier 745 is configured to amplify the RF transmit signal and output the amplified RF transmit signal at the output 734 for transmission via the antenna 715. It is to be appreciated that the transmitter 730 may include one or more additional components not shown in FIG. 7. For example, in some implementations, the transmitter 730 may include one or more filters, a phase shifter, and/or one or more additional amplifiers in the signal path between the input 732 and the output 734 of the transmitter 730.

In the example in FIG. 7, the receiver 735 has an input 736 coupled to the antenna 715 via the RF coupling circuit 725, and an output 738 coupled to the baseband processor 770. The receiver 735 may include a low noise amplifier 750, and a mixer 755. The low noise amplifier 750 is coupled between the input 736 and the mixer 755, and the mixer 755 is coupled between the low noise amplifier 750 and the output 738. In one example, the low noise amplifier 750 is configured to receive an RF signal from the antenna 715 via the RF coupling circuit 725, amplify the RF signal, and output the amplified RF signal to the mixer 755. The mixer 755 is configured to mix the RF signal with a local oscillator signal to frequency downconvert the RF signal into a baseband signal. It is to be appreciated that the receiver 735 may include one or more additional components not shown in FIG. 7. For example, in some implementations, the receiver 735 may include one or more filters, a phase shifter, and/or one or more additional amplifiers in the signal path between the input 736 and the output 738 of the receiver 735.

The RF coupling circuit 725 is coupled between the output 734 of the transmitter 730 and the antenna 715. The RF coupling circuit 725 is also coupled between the antenna 715 and the input 736 of the receiver 735. In one example, the RF coupling circuit 725 may be implemented with a duplexer configured to couple RF signals from the output 734 of the transmitter 730 to the antenna 715, and couple RF signals received from the antenna 715 to the input 736 of the receiver 735. In other implementations, the RF coupling circuit 725 may include one or more switches configured to couple the transmitter 730 and the receiver 735 to the antenna 715 one at a time.

The reference signal generator 790 is configured to generate and output a reference signal for the first PLL 780 and the second PLL 785. The reference signal generator 790 may include a crystal oscillator, or another type of circuit configured to generate the reference signal.

The first PLL 780 is coupled between the reference signal generator 790 and the mixer 740 of the transmitter 730. The first PLL 780 is configured to receive the reference signal from the reference signal generator 790 and multiply the frequency of the reference signal to generate the local oscillator signal for the mixer 740. The first PLL 780 may be implemented with the exemplary PLL 405 shown in FIG. 4, in which the signal input 422 of the first DTC 420 is coupled to the reference signal generator 790 to receive the reference signal, and the output 112 is coupled to the mixer 740.

The second PLL 785 is coupled between the reference signal generator 790 and the mixer 755 of the receiver 735. The second PLL 785 is configured to receive the reference signal from the reference signal generator 790 and multiply the frequency of the reference signal to generate the local oscillator signal for the mixer 755. The second PLL 785 may be implemented with another instance of the exemplary PLL 405 shown in FIG. 4, in which the signal input 422 of the first DTC 420 is coupled to the reference signal generator 790 to receive the reference signal, and the output 112 is coupled to the mixer 755.

Figure 8:
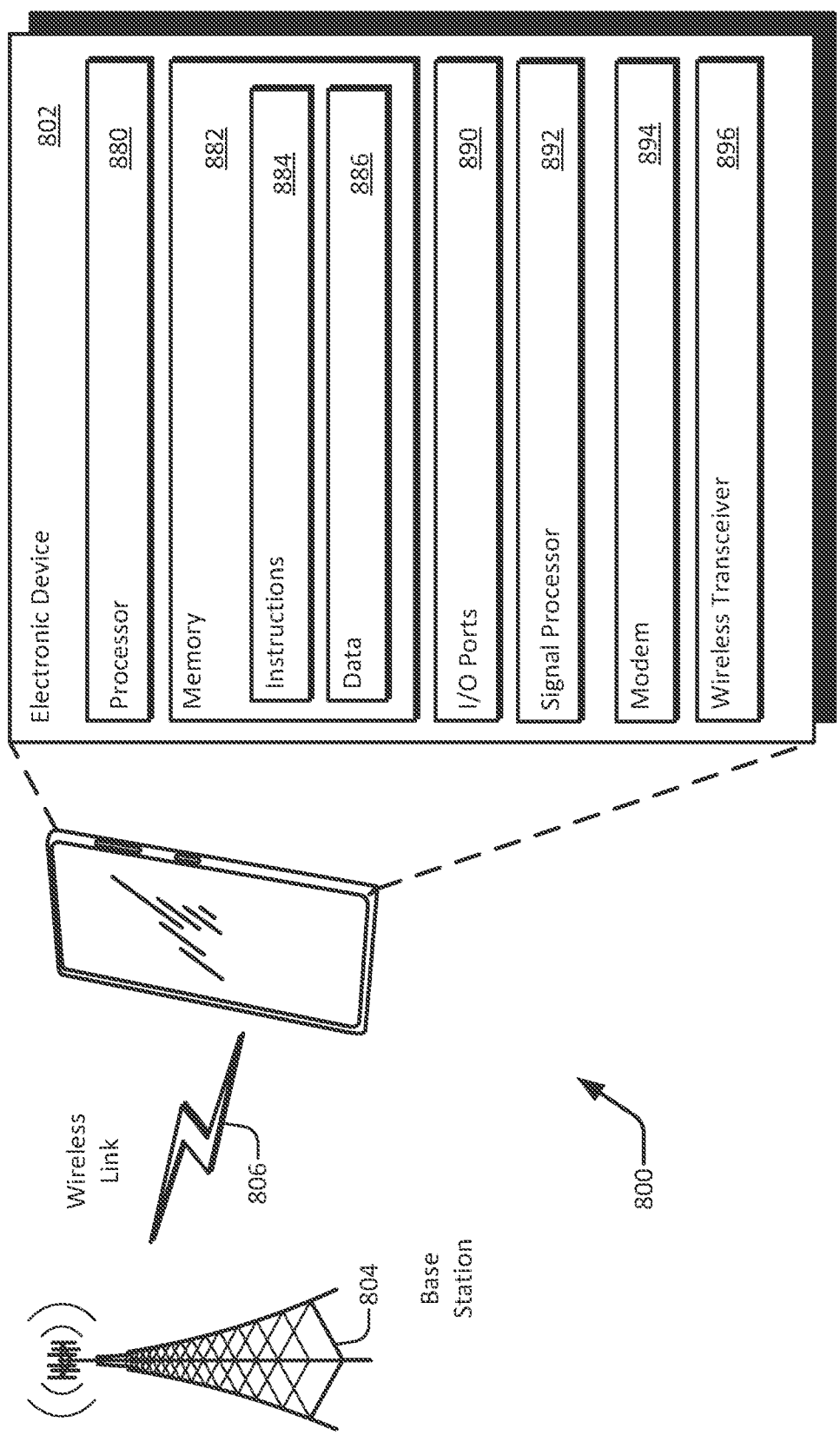
FIG. 8 is a diagram of an environment including an electronic device that includes a transceiver according to certain aspects of the present disclosure.

FIG. 8 is a diagram of an environment 800 that includes an electronic device 802 and a base station 804. The electronic device 802 includes a wireless transceiver 896, which may include the exemplary transmitter 730, receiver 735, and the PLLs 780 and 785 shown in FIG. 7. In certain aspects, the electronic device 802 may correspond to the wireless device 710 shown in FIG. 7.

In the environment 800, the electronic device 802 communicates with the base station 804 through a wireless link 806. As shown, the electronic device 802 is depicted as a smart phone. However, the electronic device 802 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 804 communicates with the electronic device 802 via the wireless link 806, which may be implemented as any suitable type of wireless link Although depicted as a base station tower of a cellular radio network, the base station 804 may represent or be implemented as another device, such as a satellite, terrestrial broadcast tower, access point, peer to peer device, mesh network node, fiber optic line, another electronic device generally as described above, and so forth. Hence, the electronic device 802 may communicate with the base station 804 or another device via a wired connection, a wireless connection, or a combination thereof. The wireless link 806 can include a downlink of data or control information communicated from the base station 804 to the electronic device 802 and an uplink of other data or control information communicated from the electronic device 802 to the base station 804. The wireless link 806 may be implemented using any suitable communication protocol or standard, such as 3rd Generation Partnership Project Long-Term Evolution (3GPP LTE, 3GPP NR 5G), IEEE 802.11, IEEE 802.11, Bluetooth™, and so forth.

The electronic device 802 includes a processor 880 and a memory 882. The memory 882 may be or form a portion of a computer readable storage medium. The processor 880 may include any type of processor, such as an application processor or a multi-core processor, that is configured to execute processor-executable instructions (e.g., code) stored by the memory 882. The memory 882 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 882 is implemented to store instructions 884, data 886, and other information of the electronic device 802.

The electronic device 802 may also include input/output (I/O) ports 890. The I/O ports 890 enable data exchanges or interaction with other devices, networks, or users or between components of the device.

The electronic device 802 may further include a signal processor (SP) 892 (e.g., such as a digital signal processor (DSP)). The signal processor 892 may function similar to the processor 880 and may be capable of executing instructions and/or processing information in conjunction with the memory 882.

For communication purposes, the electronic device 802 also includes a modem 894, the wireless transceiver 896, and one or more antennas (e.g., the antenna 715). The wireless transceiver 896 provides connectivity to respective networks and other electronic devices connected therewith using RF wireless signals. The wireless transceiver 896 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Figure 9:
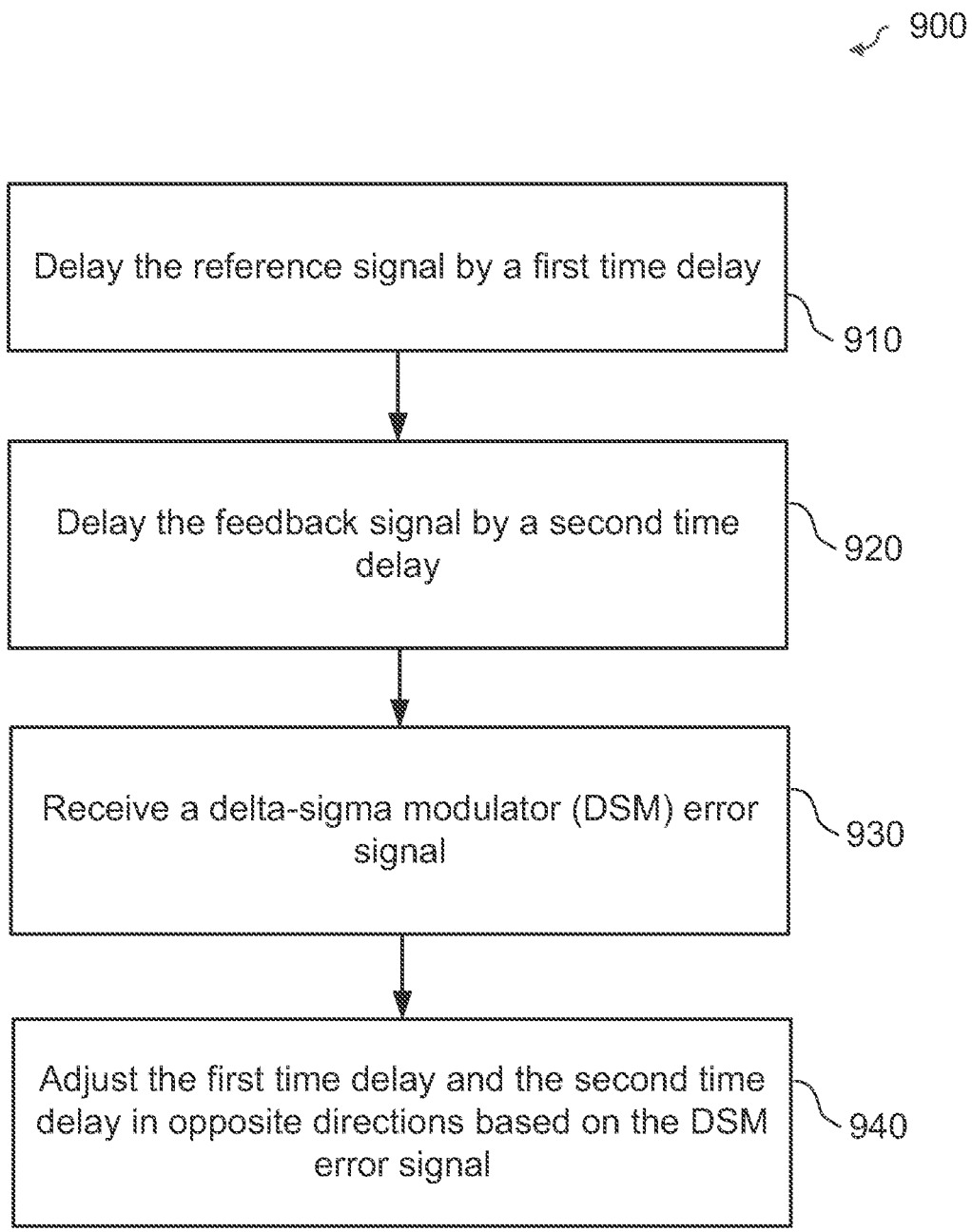
FIG. 9 is a flowchart illustrating a method of quantization noise cancellation according to certain aspects of the present disclosure.

FIG. 9 is a flowchart illustrating a method 900 of quantization noise cancellation in a phase-locked loop (PLL) according to certain aspects. The PLL (e.g., PLL 405) includes a phase detector (e.g., phase detector 120) having a first input configured to receive a reference signal and a second input configured to receive a feedback signal.

At block 910, the reference signal is delayed by a first time delay. For example, the reference signal may be delayed by the first DTC 420.

At block 920, the feedback signal is delayed by a second time delay. For example, the feedback signal may be delayed by the second DTC 430. In one example, the feedback signal may be generated by dividing the frequency of an oscillator signal by a divider. The oscillator signal may be output by a voltage-controlled oscillator (e.g., VCO 140) of the PLL. In this example, the divider may be modulated using a DSM (e.g., DSM 220).

At block 930, a delta-sigma modulator (DSM) error signal is received. For example, the DSM error signal may be received from the DSM, wherein the DSM error signal indicates a quantization error of the DSM.

At block 940, the first time delay and the second time delay are adjusted in opposite directions based on the DSM error signal. For example, the first time delay and the second time delay may be adjusted in opposite directions by the decoder 440 to produce a differential time delay that substantially cancels the quantization error indicated by the DSM error signal. In one example, the first time delay and the second time delay may be adjusted by an approximately equal amount in the opposite directions based on the DSM error signal. For example, the first time delay may be increased by the amount and the second time delay may be decreased by the approximately the same amount, or the first time delay may be decreased by the amount and the second time delay may be increased by the approximately the same amount. As used here, the first time delay and the second time delay are adjusted in opposite directions when one of the first time delay and the second time delay increases and the other one of the first time delay and the second time delay decreases.

Implementation examples are described in the following numbered clauses:

1. A system, comprising:
   a phase detector;
   a first digital-to-time converter (DTC) having a signal input, a control input, and an output, wherein the signal input of the first DTC is configured to receive a reference signal, and the output of the first DTC is coupled to a first input of the phase detector;
   a second DTC having a signal input, a control input, and an output, wherein the signal input of the second DTC is configured to receive a feedback signal, and the output of the second DTC is coupled to a second input of the phase detector; and
   a decoder having an input, a first output, and a second output, wherein the input of the decoder is configured to receive a delta-sigma modulator (DSM) error signal, the first output of the decoder is coupled to the control input of the first DTC, and the second output of the decoder is coupled to the control input of the second DTC.

2. The system of clause 1, wherein the decoder is configured to:
output a first code at the first output;
output a second code at the second output; and
adjust the first code and the second code in opposite directions based on the DSM error signal.

3. The system of clause 2, wherein:
the first DTC is configured to set a time delay of the first DTC based on the first code; and
the second DTC is configured to set a time delay of the second DTC based on the second code.

4. The system of clause 2 or 3, wherein the decoder is configured to adjust the first code and the second code by an approximately equal amount in the opposite directions based on the DSM error signal.

5. The system of any one of clauses 1 to 4, wherein the decoder is configured to adjust a time delay of the first DTC and a time delay of the second DTC in opposite directions based on the DSM error signal.

6. The system of any one of clauses 1 to 5, further comprising:
a frequency divider coupled between the signal input of the second DTC and a voltage-controlled oscillator (VCO); and
a DSM coupled to the frequency divider and the input of the decoder, wherein the DSM is configured to:
modulate a divider of the frequency divider based on a frequency control signal; and
generate the DSM error signal, wherein the DSM error signal indicates a quantization error of the DSM.

7. The system of clause 6, further comprising:
a charge pump coupled to the phase detector; and
a loop filter coupled between the charge pump and the VCO.

8. The system of clause 7, further comprising a mixer coupled to the VCO.

9. The system of clause 8, further comprising a power amplifier coupled to the mixer.

10. The system of clause 8, further comprising a low noise amplifier coupled to the mixer.

11. The system of any one of clauses 1 to 10, further comprising a reference signal generator coupled to the signal input of the first DTC.

12. The system of any one of clauses 1 to 11, further comprising a low dropout (LDO) regulator coupled to the first DTC and the second DTC.

13. A method of quantization noise cancellation in a phase-locked loop (PLL), wherein the PLL includes a phase detector having a first input configured to receive a reference signal and a second input configured to receive a feedback signal, the method comprising:
delaying the reference signal by a first time delay;
delaying the feedback signal by a second time delay;
receiving a delta-sigma modulator (DSM) error signal; and
adjusting the first time delay and the second time delay in opposite directions based on the DSM error signal.

14. The method of clause 13, further comprising:
dividing a frequency of an oscillator signal by a divider to generate the feedback signal; and
modulating the divider using a DSM, wherein the DSM error signal indicates a quantization error of the DSM.

15. The method of clause 13 or 14, wherein adjusting the first time delay and the second time delay in opposite directions based on the DSM error signal comprises adjusting the first time delay and the second time delay by an approximately equal amount in the opposite directions based on the DSM error signal.

16. The method of any one of clauses 13 to 15, wherein:
delaying the reference signal by the first time delay comprises delaying the reference signal by the first time delay based a first code using a first digital-to-time converter (DTC);
delaying the feedback signal by the second time delay comprises delaying the feedback signal by the second time delay based a second code using a second DTC; and
adjusting the first time delay and the second time delay in opposite directions based on the DSM error signal comprises adjusting the first code and the second code in opposite directions based on the DSM error signal.

17. An apparatus, comprising:
means for detecting a phase error between a reference signal and a feedback signal;
means for delaying the reference signal by a first time delay;
means for delaying the feedback signal by a second time delay; and
means for adjusting the first time delay and the second time delay in opposite directions based on a delta-sigma modulator (DSM) error signal.

18. The apparatus of clause 17, wherein the means for adjusting the first time delay and the second time delay in opposite directions based on the DSM error signal comprises means for adjusting the first time delay and the second time delay by an approximately equal amount in the opposite directions based on the DSM error signal.

19. The apparatus of clause 17 or 18, further comprising means for dividing a frequency of an oscillator signal by a divider to generate the feedback signal.

20. The apparatus of clause 19, further comprising a DSM configured to:
modulate the divider based on a frequency control signal; and
generate the DSM error signal based on a quantization error of the DSM.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. A system, comprising:
a phase detector;

a first digital-to-time converter (DTC) having a signal input, a control input, and an output, wherein the signal input of the first DTC is configured to receive a reference signal, and the output of the first DTC is coupled to a first input of the phase detector;
a second DTC having a signal input, a control input, and an output, wherein the signal input of the second DTC is configured to receive a feedback signal, and the output of the second DTC is coupled to a second input of the phase detector; and
a decoder having an input, a first output, and a second output, wherein the input of the decoder is configured to receive a delta-sigma modulator (DSM) error signal, the first output of the decoder is coupled to the control input of the first DTC, and the second output of the decoder is coupled to the control input of the second DTC.

2. The system of claim 1, wherein the decoder is configured to:
output a first code at the first output;
output a second code at the second output; and
adjust the first code and the second code in opposite directions based on the DSM error signal.

3. The system of claim 2, wherein:
the first DTC is configured to set a time delay of the first DTC based on the first code; and
the second DTC is configured to set a time delay of the second DTC based on the second code.

4. The system of claim 2, wherein the decoder is configured to adjust the first code and the second code by an approximately equal amount in the opposite directions based on the DSM error signal.

5. The system of claim 1, wherein the decoder is configured to adjust a time delay of the first DTC and a time delay of the second DTC in opposite directions based on the DSM error signal.

6. The system of claim 1, further comprising:
a frequency divider coupled between the signal input of the second DTC and a voltage-controlled oscillator (VCO); and
a DSM coupled to the frequency divider and the input of the decoder, wherein the DSM is configured to:
modulate a divider of the frequency divider based on a frequency control signal; and
generate the DSM error signal, wherein the DSM error signal indicates a quantization error of the DSM.

7. The system of claim 6, further comprising:
a charge pump coupled to the phase detector; and
a loop filter coupled between the charge pump and the VCO.

8. The system of claim 7, further comprising a mixer coupled to the VCO.

9. The system of claim 8, further comprising a power amplifier coupled to the mixer.

10. The system of claim 8, further comprising a low noise amplifier coupled to the mixer.

11. The system of claim 1, further comprising a reference signal generator coupled to the signal input of the first DTC.

12. The system of claim 1, further comprising a low dropout (LDO) regulator coupled to the first DTC and the second DTC.

13. A method of quantization noise cancellation in a phase-locked loop (PLL), wherein the PLL includes a phase detector having a first input configured to receive a reference signal and a second input configured to receive a feedback signal, the method comprising:
delaying the reference signal by a first time delay;
delaying the feedback signal by a second time delay;
receiving a delta-sigma modulator (DSM) error signal; and
adjusting the first time delay and the second time delay in opposite directions based on the DSM error signal.

14. The method of claim 13, further comprising:
dividing a frequency of an oscillator signal by a divider to generate the feedback signal; and
modulating the divider using a DSM, wherein the DSM error signal indicates a quantization error of the DSM.

15. The method of claim 13, wherein adjusting the first time delay and the second time delay in opposite directions based on the DSM error signal comprises adjusting the first time delay and the second time delay by an approximately equal amount in the opposite directions based on the DSM error signal.

16. The method of claim 13, wherein:
delaying the reference signal by the first time delay comprises delaying the reference signal by the first time delay based a first code using a first digital-to-time converter (DTC);
delaying the feedback signal by the second time delay comprises delaying the feedback signal by the second time delay based a second code using a second DTC; and
adjusting the first time delay and the second time delay in opposite directions based on the DSM error signal comprises adjusting the first code and the second code in opposite directions based on the DSM error signal.

17. An apparatus, comprising:
means for detecting a phase error between a reference signal and a feedback signal;
means for delaying the reference signal by a first time delay;
means for delaying the feedback signal by a second time delay; and
means for adjusting the first time delay and the second time delay in opposite directions based on a delta-sigma modulator (DSM) error signal.

18. The apparatus of claim 17, wherein the means for adjusting the first time delay and the second time delay in opposite directions based on the DSM error signal comprises means for adjusting the first time delay and the second time delay by an approximately equal amount in the opposite directions based on the DSM error signal.

19. The apparatus of claim 17, further comprising means for dividing a frequency of an oscillator signal by a divider to generate the feedback signal.

20. The apparatus of claim 19, further comprising a DSM configured to:
modulate the divider based on a frequency control signal; and
generate the DSM error signal based on a quantization error of the DSM.

* * * * *